United States Patent
Van Der Meulen et al.

(10) Patent No.: US 7,184,121 B2
(45) Date of Patent: Feb. 27, 2007

(54) LITHOGRAPHIC APPARATUS, DEVICE MANUFACTURING METHOD, AND DEVICE MANUFACTURED THEREBY

(75) Inventors: Frits Van Der Meulen, Breda (NL); Hernes Jacobs, Eindhoven (NL); Martinus Arnoldus Henricus Terken, Lierop (NL)

(73) Assignee: ASML Netherlands B.V., Veldhoven (NL)

( * ) Notice: Subject to any disclaimer, the term of this patent is extended or adjusted under 35 U.S.C. 154(b) by 177 days.

(21) Appl. No.: 10/845,604

(22) Filed: May 14, 2004

(65) Prior Publication Data

US 2005/0007574 A1    Jan. 13, 2005

(30) Foreign Application Priority Data

May 16, 2003   (EP)   ................... 03253057

(51) Int. Cl.
G03B 27/32   (2006.01)
G03B 27/42   (2006.01)

(52) U.S. Cl. .......................................... 355/53; 355/77

(58) Field of Classification Search ................. 355/53, 355/72, 75, 77; 269/37, 45
See application file for complete search history.

(56) References Cited

U.S. PATENT DOCUMENTS 5,040,431 A    8/1991   Sakino et al.
6,498,350 B2 *  12/2002 Kwan et al. ............ 250/442.11
6,538,720 B2 *  3/2003  Galburt et al. ................ 355/53
2001/0004105 A1  6/2001  Kwan et al.
2001/0050341 A1  12/2001 Kwan et al.
2003/0169409 A1  9/2003  Nishi

FOREIGN PATENT DOCUMENTS

| EP | 1 111 469 A2 | 6/2001 |
| EP | 1 111 472 A2 | 6/2001 |
| EP | 1107067 A2 | 6/2001 |
| EP | 1111471 A2 | 6/2001 |
| EP | 1372038 A1 | 12/2003 |
| JP | 02002104 A | 8/1990 |
| JP | 2001 110699 | 4/2001 |
| WO | WO 03/015139 A1 | 2/2003 |

OTHER PUBLICATIONS

European Search Report dated Aug. 20, 2003.
European Search Report dated May 6, 2005.

\* cited by examiner

*Primary Examiner*—Rodney Fuller
(74) *Attorney, Agent, or Firm*—Pillsbury Winthrop Shaw Pittman LLP

(57) ABSTRACT

A lithographic projection apparatus is presented herein that includes a collision protection system for protecting internal components against damage from a collision. The collision protection apparatus includes at least one damper for applying a braking force and/or for absorbing a collision force, reducing or eliminating any damage to delicate and costly parts. The collision protection apparatus can also monitor the position and velocity of a moving part to determine when a collision is likely to occur.

21 Claims, 7 Drawing Sheets

- - - - - -  2 m/s
– – –  1.5 m/s
– · – ·  1 m/s
— —  0.5 m/s

LITHOGRAPHIC APPARATUS, DEVICE MANUFACTURING METHOD, AND DEVICE MANUFACTURED THEREBY

BACKGROUND OF THE INVENTION

1. Priority Information

This application claims priority from European Patent Application No. 03253057.8, filed May 16, 2003, the contents of which are herein incorporated by reference in its entirety.

2. Field of the Invention

The present invention relates to a lithographic apparatus and associated device manufacturing methods.

3. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist).

In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

As indicated above, during the manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features.

This array of procedures is used as a basis to pattern an individual layer of a device, e.g. an IC. Such a patterned layer may then undergo various processes such as etching, ion-implantation (doping), metallization, oxidation, chemical-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

During the manufacturing process the movement of tables, for example mask or substrate tables, may be controlled in as many as six degrees of freedom (translation along three mutually orthogonal axes and rotation about those axes). Movements can occur at high velocity. At high velocity the kinetic energy of the table is high and a collision is likely to cause damage to delicate and expensive parts of the apparatus.

Collisions may occur in several circumstances, for example: (a) horizontally with the walls of the apparatus defining the area in which the table can move; (b) horizontally with other tables in a multiple stage device (these may have two or more tables operating in the same area); and (c) vertically with the parts of the imaging system, for example the lens.

SUMMARY OF THE INVENTION

For at least these reasons, the principles of the present invention, as embodied and broadly described herein, provide for a collision protection configuration that avoids collisions or reduces the damage caused by such collisions. In one embodiment, a lithographic apparatus is presented, comprising an illumination system for providing a projection beam of radiation; a support structure for supporting a patterning device, the patterning device serving to impart the projection beam with a pattern in its cross-section; a substrate table for holding a substrate; and a projection system for projecting the patterned beam onto a target portion of the substrate. The apparatus further includes a collision protection system to avoid collisions between a first and a second part of the apparatus which can be relatively moved by at least one actuator system, in which the collision protection comprises at least one sensor system to determine the relative position and/or velocity of the first and second parts of the apparatus and a controller to control the actuator system to prevent the first and second parts moving closer together in the event that the sensor system determines that the relative positions and/or velocity of the first and second parts are indicative of a potential collision.

The provision of a collision protection system allows any damage to parts involved in a collision within the lithographic apparatus to be minimized or reduced to zero. In the event of a collision no expensive repair costs are incurred and the lithographic apparatus can return to production with very little lost production time In an embodiment of the present invention, the first part is corresponds to the substrate table and the at least one sensor system is adapted to measure the position and velocity of the substrate table. In addition, the controller is adapted to control the velocity of the substrate table on the basis of the measured position and velocity from the at least one sensor, knowledge of the positions of potential obstacles to the table and knowledge of the stopping distance of the table.

The collision protection apparatus then takes an active role to ensure that collisions are prevented. The position of the table relative to the known positions of obstacles determines the maximum allowed velocity of the table. If an obstacle is close, velocity towards the obstacle is restricted to small magnitudes. The actual velocity allowed is calculated from the stopping distance. Limiting the velocity in this way ensures that there is always sufficient stopping distance to avoid a collision. Furthermore, in the worst case, when a collision does occur, the velocity will be small, thereby limiting the damage.

In a further embodiment of the present invention, the controller is adapted to control said actuator system to ensure that the measured distance between the first and second parts remains greater than a predetermined minimum distance and/or for ensuring that the measured velocity does not exceed a predetermined maximum velocity.

The measured value of distance and/or speed allows the table to be controlled within predetermined limits. A minimum distance provides a safety margin to avoid collisions. Limiting the maximum velocity limits the maximum kinetic energy and reduces the damage arising from a collision. In the case when both velocity and distance are measured, the limit of velocity may be set to a value that can safely be decelerated before a collision, should the distance become smaller than the minimum distance.

The controller may be a switch that simply powers down the actuators moving the first and/or second parts when the predetermined limits are exceeded. Optionally, should the distance become smaller than the allowed minimum distance, an emergency braking or reverse movement can be initiated using a damper or actuator.

According to another embodiment of the invention, there is provided a lithographic apparatus comprising an illumination system for providing a projection beam of radiation; a support structure for supporting a patterning device, the patterning device serving to impart the projection beam with a pattern in its cross-section; a substrate table for holding a substrate; and a projection system for projecting the patterned beam onto a target portion of the substrate. The apparatus further includes a collision protection system to avoid collisions between a first and a second part of the apparatus that might be caused by relative motion of said first and second parts in a first direction parallel to an optical axis of said projection system.

The present invention can therefore avoid collisions in the vertical direction, e.g. between the projection system (or one of a plurality of optical engines making up the projection system) and the substrate.

In another embodiment, the collision protection system further comprises a rim which projects beyond at least one edge of said first part in the first direction, the rim being connected to the first part by at least one damper for relative movement thereto.

In the event of a collision occurring, the rim moves relative to the first part while the damper limits the force transmitted thereto. The first part is therefore protected from damage when a collision occurs. The at least one damper may be passive or active and may operate by, for example, viscous forces in an oil damper, eddy currents due to electromagnetic effects or friction. Alternatively, the at least one damper may deform by elastic or plastic deformation. If the damper is of a resilient type, for example a shape-memory metal exhibiting super-elastic properties, the rim will return to its previous position after impact. The lithographic apparatus can then return to production with minimal delay.

According to another embodiment of the invention, there is provided a device manufacturing method comprising providing a substrate; providing a projection beam of radiation using an illumination system; using a patterning device to impart the projection beam with a pattern in its cross-section; and projecting the patterned beam of radiation onto a target portion of the substrate. The method further comprises measuring the position and/or velocity of the moving part; determining when a collision between a moving part of an apparatus and an obstacle is likely to occur; and controlling movement of the moving part to avoid or reduce the severity of a collision.

The damage caused to parts of the apparatus involved in a collision can then be reduced. A damping force absorbs the force of an impact to dissipate the kinetic energy and ensure that the parts involved in the collision are not damaged.

Using the measured position and/or velocity it is possible to predict when a collision is likely. For example, a moving part may have moved into the safety distance around another part. Alternatively a moving part may be moving too fast to stop before hitting an obstacle.

A braking force may be applied to reduce the velocity of a moving part when it is determined a collision is likely. Ideally, the braking force will stop the movement before any collision occurs. However, it will also reduce the kinetic energy of the moving part with a subsequent reduction in damage if the movement is not stopped. Preferably, the brake comprises first and second brake members which are biased towards each other and which generate a braking force when in contact with each other and a release mechanism for holding them apart, the release mechanism being constructed to allow the brake members to come together on receipt of a brake release signal or in the event of a power failure.

According to an embodiment of the present invention, the measuring may measure the position and velocity of the moving part and the method may further comprise comparing the measured position and velocity with known positions of obstacles and a known stopping distance of the moving part and controlling the velocity of the moving part dependent upon the result of the comparison. Thus the velocity can be controlled to always allow sufficient stopping distance to avoid a collision.

According to a further embodiment of the present invention, the measuring may measure the distance between the moving part and the obstacle and/or measure the velocity of the moving part towards the obstacle, the method further comprising controlling the velocity of the moving part to ensure that the measured distance is greater than a predetermined minimum distance and/or to ensure that the measured velocity does not exceed a predetermined maximum velocity.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat panel displays (e.g. LCDs), thin-film magnetic heads, etc.

The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to devices that can be used to impart a projection beam with a pattern in its cross-section such as to create a pattern in a target portion of the substrate.

It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Lithographic Apparatus

Figure 1:
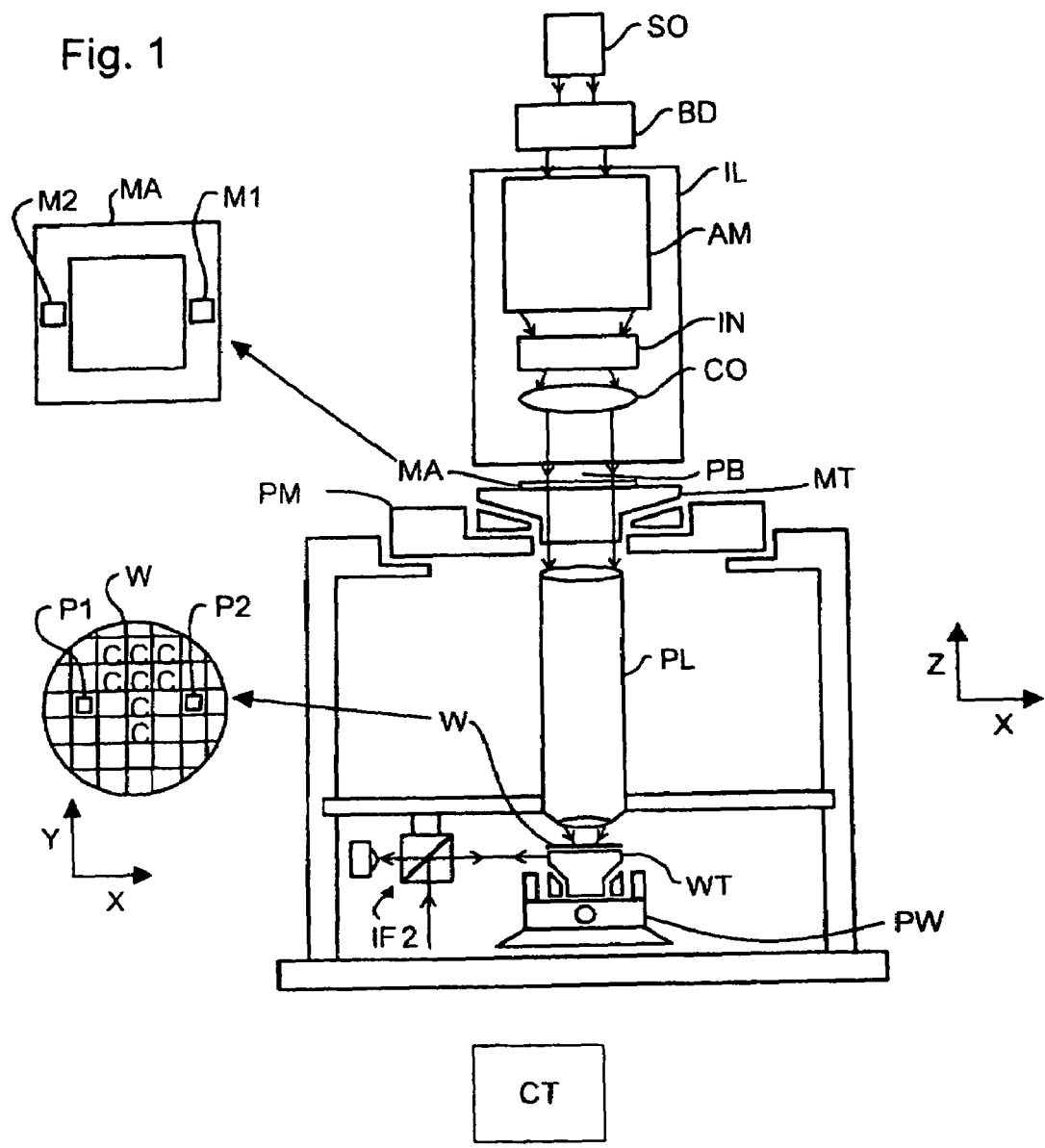
FIG. 1 depicts a lithographic projection apparatus, according to an embodiment of the invention.

FIG. 1 schematically depicts a lithographic apparatus according to a particular embodiment of the invention. The apparatus comprises:

an illumination system IL: for supplying a beam PB of radiation (e.g. UV or DUV radiation);

a first support structure (mask table) MT: for supporting a patterning device (e.g. a reticle or mask MA), and connected to first positioning mechanism PM for accurately positioning the mask with respect to item PL;

a substrate table (substrate holder) WT: for holding a substrate W (e.g. a resist-coated silicon wafer) and connected to second positioning mechanism PW for accurately positioning the substrate W with respect to item PL; and a projection system ("lens") PL: for imaging a pattern imparted to the beam of radiation by patterning device onto a target portion C (e.g. comprising one or more dies) of the substrate W.

As here depicted, the apparatus is of a transmissive type (i.e., employing a transmissive mask). However, in general, it may also be of a reflective type, for example, such as a programmable mirror array of a type as referred to above.

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise adjusting mechanism for adjusting the angular intensity distribution of the beam.

Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning mechanism PW and position sensor IF2 (e.g. an interferometric device), the substrate table WT can be moved accurately, e.g. so as to position different target portions C in the path of the beam PB. Similarly, the first positioning mechanism PM and position sensor IF1 can be used to accurately position the mask MA with respect to the path of the beam PB, e.g. after mechanical retrieval from a mask library, or during a scan.

In general, movement of the object tables MT and WT will be realized with the aid of a long-stroke module and a short-stroke module, which form part of the positioning mechanism PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:
  step mode: the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.
  scan mode: the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
  other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

First Embodiment

Figure 2:
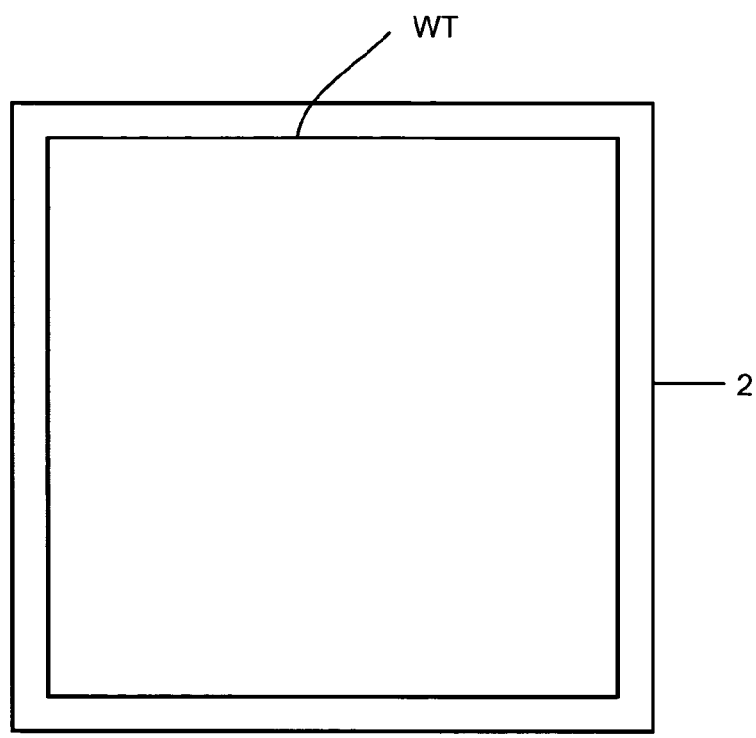
FIG. 2 is a plan view of a crash rim, according to a first embodiment of the present invention.
Figure 3:
FIG. 3 is a side view of a crash rim, according to a first embodiment of the present invention.

FIG. 2 is a plan view of the wafer table WT equipped with a crash protection rim 2. A side view of the crash protection rim 2 and wafer table WT is shown in FIG. 3. The rim 2 projects out from the edges of the wafer table WT and is mounted so that it can move relative to the wafer table WT when an impact occurs.

At least one damper connects the rim 2 to the wafer table WT. In this embodiment, the damper is constructed from a super-elastic memory metal. For example, a metal from the family of alloys known as "nitinol" comprising a nearly equal mixture of nickel (55% by weight) and titanium evincing such characteristics may be used. It will be appreciated that other constructions of dampers are possible, for example, an oil or elastic spring based damper or a damper designed to deform plastically when an impact occurs.

When the rim 2 hits an obstacle it moves relative to the wafer table WT. The damper is compressed and the force of the impact reaching the wafer table WT is reduced. In this embodiment, the use of a super elastic memory metal enables the damper to be reduced in size and weight over the alternatives.

Figure 4:
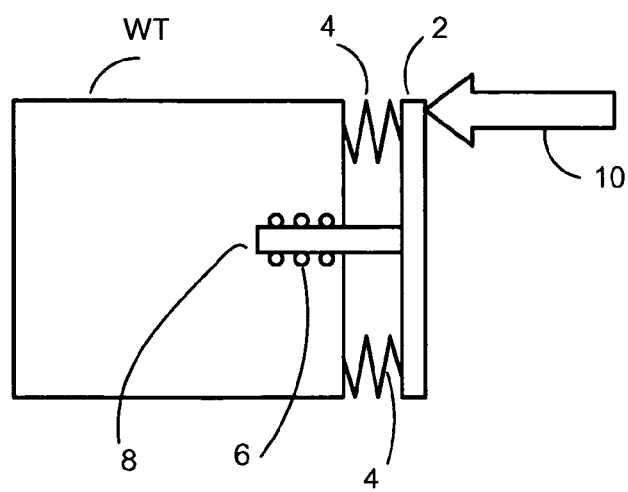
FIG. 4 is a plan view of an off-center impact on a crash rim, according to the first embodiment of the present invention.

FIG. 4 illustrates the arrangements of dampers 4 on one side of the crash protection rim 2. Two dampers 4 are mounted at two corners of the wafer table WT, connecting the wafer table WT and the rim 2. A rod 8 is attached to the crash protection rim 2 and is constrained to move in a single direction by a linear bearing 6. In this way an off-center impact, such as that illustrated by the arrow 10, is spread evenly between the two dampers 4.

It will be appreciated that if the rod 8 and bearing 6 were not present, an off-center impact would be focused on one of the dampers 4 and not spread evenly. In other words, rim 2 would tend to rotate as well as moving in the direction of the force. The crash stroke for an off-center impact would then be larger than a central impact, which would present problems with design.

The physical design of the dampers must consider the likely kinetic energy and forces involved in an impact, the maximum force which can be transferred to the wafer table WT without causing damage, and the maximum allowable crash stroke. It is desirable for the crash stroke to be as small as possible, reducing the distance that the rim 2 must project out of the wafer table WT and allowing a smaller, lighter construction.

The crash rim 2 also incorporates a positioning mechanism to ensure that it remains in the correct position during normal operation and returns to the correct position after a collision. The position of the crash rim 2 relative to the table WT is monitored by a crash detection sensor (not shown). Should a collision occur the crash detection sensor detects that the rim 2 has moved and stops the manufacturing process.

Although FIG. 4 only illustrates a rim 2 provided on one side of the wafer table WT, it will be appreciated that the construction can be applied to the other sides if required. Furthermore, although the construction of a crash rim for a wafer table WT has been described, it could equally be applied to a mask table MT.

Second Embodiment

Figure 5:
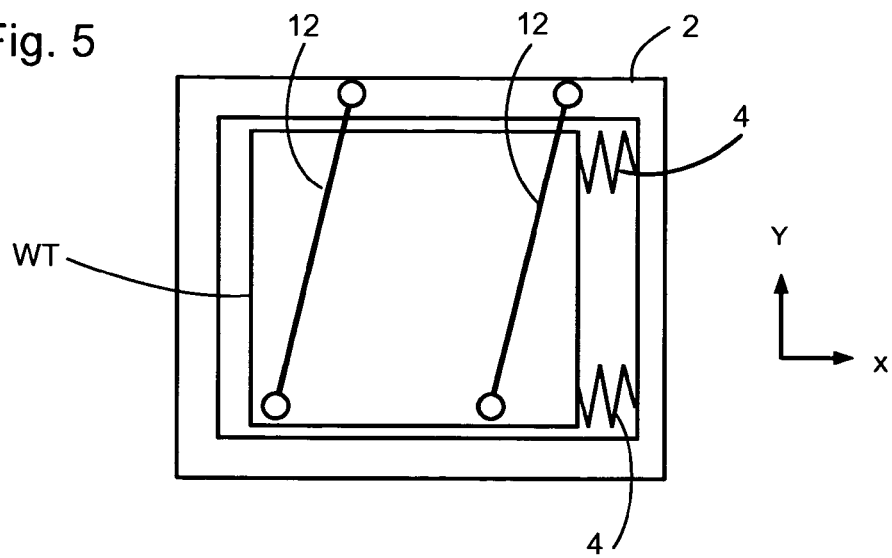
FIG. 5 is a plan view of the arrangement of dampers, according to a second embodiment of the present invention.

FIG. 5 illustrates a second embodiment, in accordance with the present invention. The second embodiment has similar characteristics to the construction of the crash rim of the first embodiment, except for the attributes described below.

In the second embodiment, the crash rim 2 extends around all sides of the wafer table WT as a single piece construction. Two dampers 4 are connected between the side of the rim 2 furthest from the wafer table WT in the X direction and the side of the wafer table WT directly opposite. A pair of connecting members 12, connect the side of the crash rim 2 furthest from the wafer table WT in the Y direction with the side of the wafer table furthest from that side of the crash rim 2 via pin joints.

As such, the connecting members 12 form a parallelogram configuration, being connected in a position further in the +X direction on the crash rim 2 than on the wafer table WT. The connecting members 12 are pre-tensioned springs and will therefore only deform in the Y direction when a force greater than the pre-tensioning force is applied.

This construction allows the mechanism to spread the force of off-center impacts in the X direction between the dampers 4. The force in the Y direction of an import predominantly in the X direction will be small, less than the pre-tensioning force. The connecting members 12 therefore do not deform and rotate in the parallelogram configuration. This prevents rotation of the crash rim 2 and spreads the force evenly between the dampers 2.

For impacts in the Y direction, the connecting members 12 themselves function as the dampers because the force is greater than the pre-tensioning force. However, in the Y direction there is no mechanism to spread the force of an off-center impact between the two connecting members 12 because the crash rim 2 can rotate.

Figure 6:
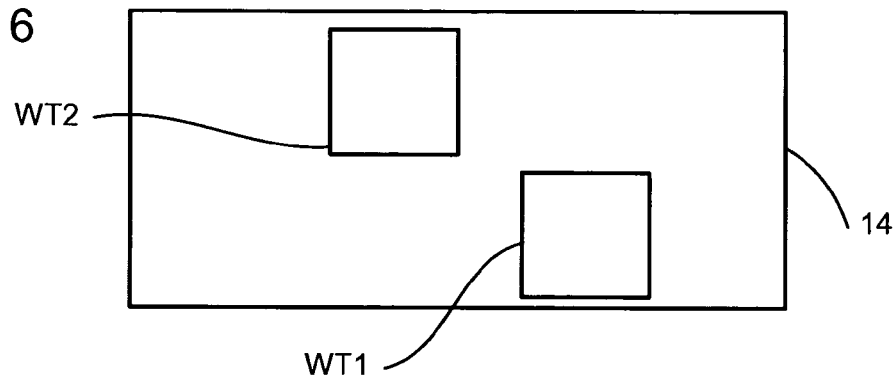
FIG. 6 is a plan view of the relative positions of two wafer tables in a multi-stage apparatus, according to a second embodiment of the present invention.

The construction of the crash rim 2 is optimized based on the obstacles likely to be faced by a wafer table WT when moving in a multi-table apparatus. FIG. 6 illustrates two wafer tables WT1, WT2 moving in a multi-table apparatus. The area of movement is defined by a rectangular wall 14. The wafer table WT1 can collide with the wall 14 or the other wafer table WT2. In the +X and -X directions any off-center impact is spread evenly between the dampers 4 by the parallelogram assembly of the connecting members 12 as described above.

In the -Y direction the wafer table WT1 can only hit the wall. Any impact in this direction will therefore be spread evenly across the crash protection rim on that side. In the +Y direction the wafer table WT1 can hit the other wafer table WT2. However, the small space between the two wafer tables in this situation leads to a low crash velocity and a lower crash force than in the X direction. It is, therefore, possible to absorb the force without providing a compensating mechanism to spread the force evenly between the connecting members 12. It is to be noted that a typical crash stoke in the +Y direction would be 3 mm.

In this embodiment, only two dampers and two pre-tensioned springs are implemented. This allows the overall construction to be light and inexpensive. The construction is optimized so that the crash rim 2 is only prevented from rotating in the direction where an off-center collision is more likely. The construction of this embodiment can easily be adapted to provide crash protection for a mask table.

Third Embodiment

Figure 7:
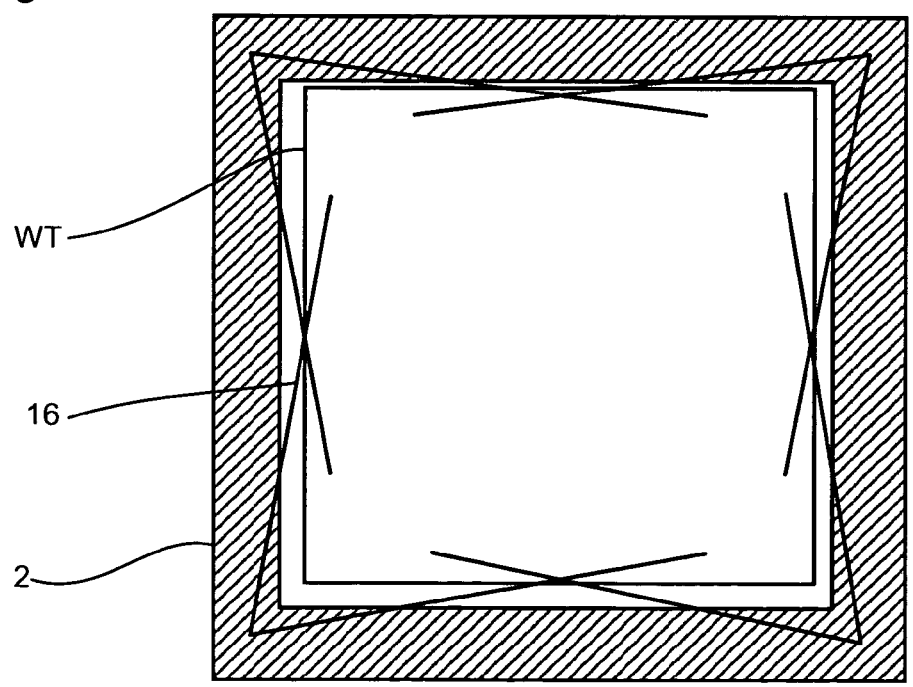
FIG. 7 is a plan view of the arrangement of dampers, according to a third embodiment of the present invention.

FIG. 7 is a plan view of the construction of a crash protection rim according to a third embodiment of the present invention. The third embodiment has similar characteristics to the construction of the crash rim of the first embodiment, except for the attributes described below.

A single piece crash protection rim 2 is connected to the wafer table WT by eight dampers 16. As with the first embodiment, the dampers 16 are constructed from a super-elastic memory metal, but alternatives such as oil or elastic spring dampers may also be used. Each corner of the crash protection rim 2 has two dampers attached to a common point. The dampers from each corner of the rim 2 are connected in a triangular layout to positions on the wafer table WT.

The dampers 16 will buckle under a compressive load, they are only active when subjected to a tensile load. Therefore, two dampers will be active when a collision with one side of the crash protection rim occurs. In operation, the dampers 16 operate in a similar manner to pre-tensioned springs and only deform when the crash force is higher then the pre-tensioned force. The wires perpendicular to the crash direction will not deform because the load is not higher than the pre-tensioned force.

The pretension force in the x and y directions does not have to be equal. Both the ratio of the likely collision force in the x direction to the likely collision force in the y direction and the x:y ratio of the rim dimension can be used to optimize the ratio of the x:y pre-tensioned force.

The construction of the embodiment can easily be adapted for a mask table MT. Although a triangular layout of dampers has been described, it will be appreciated that a rectangular arrangement can also be used.

Embodiment 4

Figure 8:
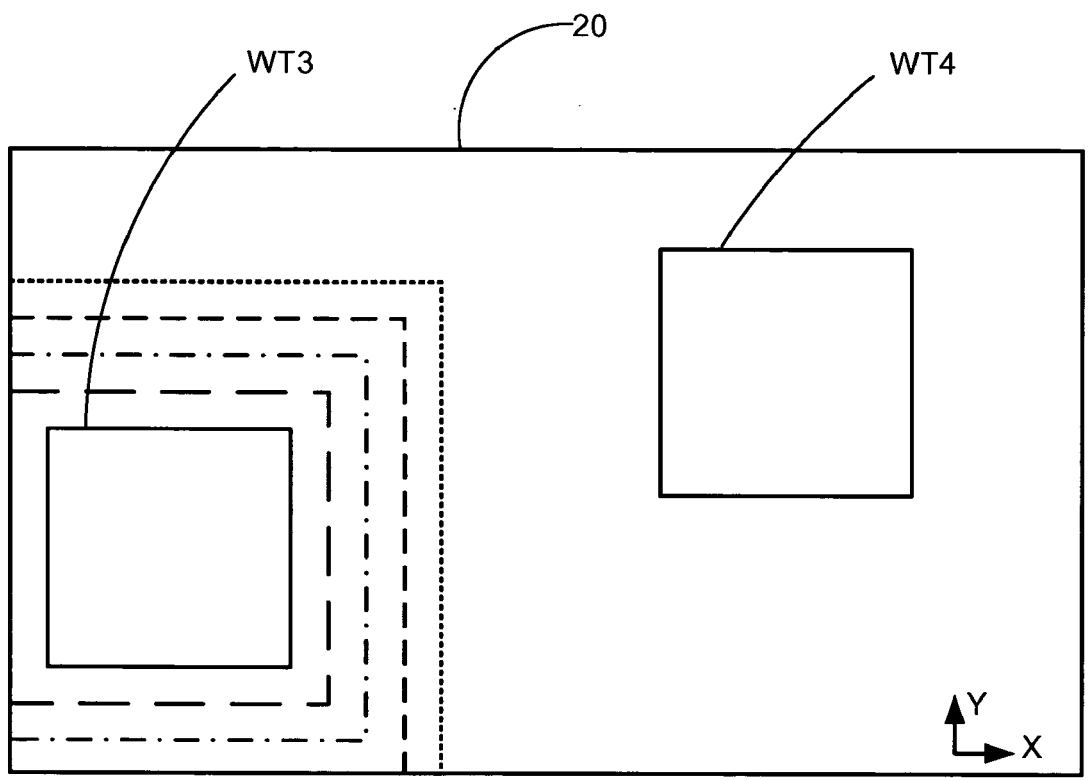
FIG. 8 depicts a field of maximum velocities of a pair of substrate tables in a fourth embodiment of the invention.

FIG. 8 illustrates a fourth embodiment of the present invention. The fourth embodiment has similar characteristics to the first embodiment, except for the attributes described below.

Wafer tables WT3, WT4 form part of a multi-stage apparatus and move in a common area defined by the wall 20. In this embodiment, a crash protection rim is not provided on the wafer tables WT3, WT4. Instead, at least one sensor (not illustrated) measures the position and velocity of the wafer tables WT3, WT4.

A controller calculates maximum allowed velocities of the wafer tables WT3, WT4 using the position of potential obstacles. For the wafer table WT3 in FIG. 8, potential obstacles are formed by the other wafer table WT4 and the wall 20. The controller calculates the maximum allowed velocity using the distance from the wafer table WT to the obstacle.

Figure 9:
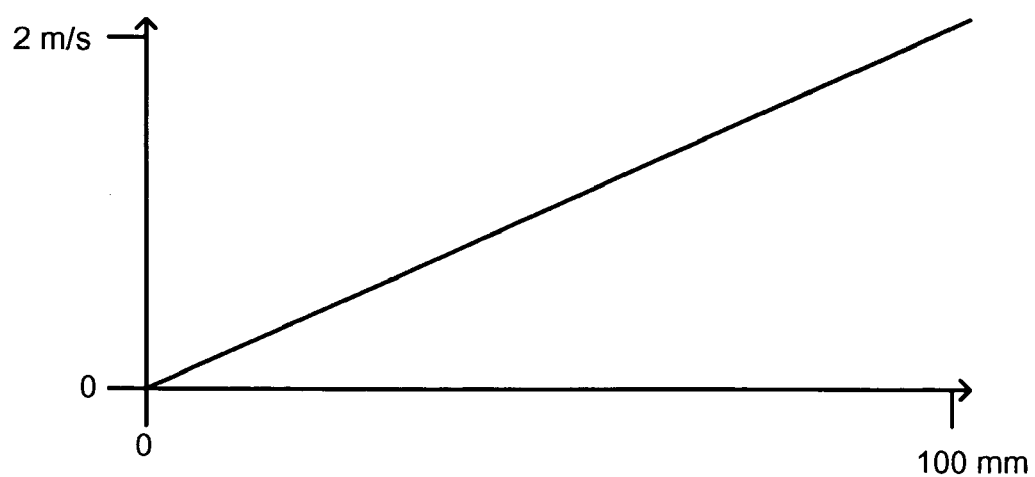
FIG. 9 is a graph showing the variation of maximum velocity with distance from an obstacle in a fourth embodiment of an invention.

In this embodiment, a linear relationship between distance to an obstacle and the maximum velocity in that direction, illustrated in FIG. 9, is used. The contour lines in FIG. 8 illustrate applying this relationship to the wafer table WT3. From FIG. 8 it can be seen that the wall 20 in the -X direction is close to the wafer table WT3. In this direction, the maximum velocity is limited to only approximately 0.4 m/s. However, in the +X direction, the only obstacle is the other wafer table WT4, which is greater than 100 mm away. In this direction, the maximum permitted velocity is 2 m/s.

By controlling the velocity in this way, the kinetic energy of the wafer table WT3 can be controlled to be small in situations where a collision is more likely to occur. Additionally the maximum velocity is set to be sufficient to allow the wafer table WT3 to stop before reaching the obstacle.

In a situation when the controller determines that a collision is likely to occur, an emergency braking is initiated. This emergency braking can be initiated through electromagnetic eddy currents, friction, and other devices. A suitable emergency brake may comprise two brake shoes mounted on a carrier of the table and biased towards a brake bar, e.g. by mechanical springs. A release mechanism, e.g. including an electromagnet, holds the brake shoes away from the brake bar during normal use but releases them on receipt of a brake signal from the controller. The release mechanism is also arranged to release the brake shoes automatically in the event of power failure. Alternatively, the velocity could be reversed when a collision is likely to occur.

Other maximum velocity profiles than the one in FIG. 9 can be used. For example, the velocity profile may calculated with knowledge of the stopping distance at each velocity. This will give a non-linear variation to the velocity profile.

A crash protection rim of the above-described first to third embodiments may also be provided in a lithographic apparatus fitted with the controlled maximum velocity system of this embodiment.

Embodiment 5

Figure 10:
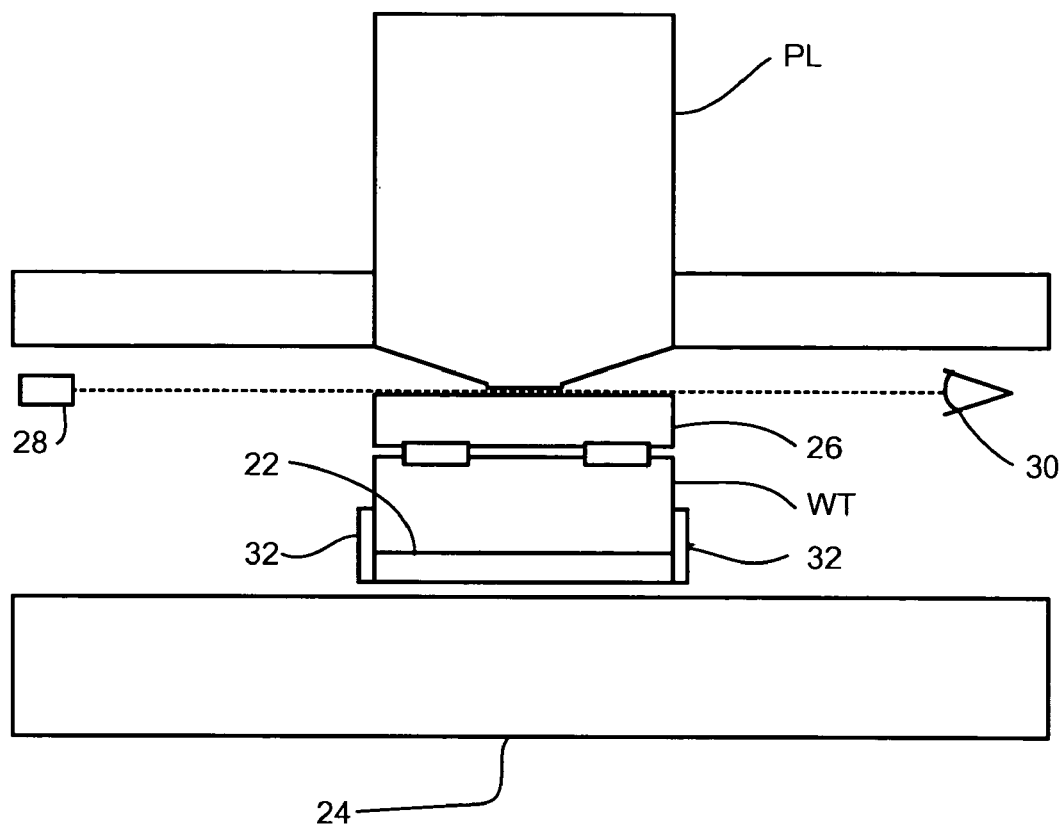
FIG. 10 depicts a lithographic apparatus according to a fifth embodiment of the present invention.

A fifth embodiment of the present invention is depicted in FIG. 10. The fifth embodiment has similar characteristics to the first embodiment, except for the attributes described below. In this embodiment, the wafer table WT is a driven by a planar motor 22 above a magnet plate 24. The planar motor is controlled with six degrees of freedom (translation and rotation about three mutually orthogonal axes). A mirror block 26 is mounted above the wafer table WT for use when aligning the wafer with the projection lens PL.

A light source 28 is attached to one side of the apparatus and a corresponding detector 30 is attached to the opposite side of the apparatus. The light source 28 and detector 30 are arranged just below the projection lens PL. Thus, when the mirror block 26 approaches the projection lens PL the light source is partially or fully obscured.

Gap sensors 32 are provided at the lower edge of the wafer table WT. Sensors 32 measure the distance from the bottom of the planar motor 22 to the magnet plate 24. This provides an indirect measure of the distance from the top of the mirror block 26 to the projection lens PL, since the combined height of the wafer table WT and mirror block 26 is known, as is the distance from the magnet plate to the projection lens PL.

In operation, a controller monitors the output from the light source detector 30 and the gap sensors 32 to determine the distance of the mirror block from the projection lens PL. In normal operation, the wafer table WT is controlled to keep it at a minimum distance from the projection lens PL. If it is determined that the mirror block 26 is too close to the projection lens PL an emergency stop can be initiated. The emergency stop could be active, for example, applying a braking force, or passive, for example, turning off the power supply and allowing gravity to decelerate the table. Alternatively, the wafer table WT can be automatically moved down in an emergency to avoid the risk of a collision.

Wafer table WT vertical velocity is also measured by the gap sensors 32. The controller is then capable of limiting the vertical velocity of the wafer table WT and, hence, reduces the damage caused should a collision occur. The maximum vertical velocity can be chosen such that when an emergency stop occurs because the wafer table WT is too close to the mirror block 26, the deceleration due to gravity will stop the wafer table WT before a collision occurs.

Figure 11:
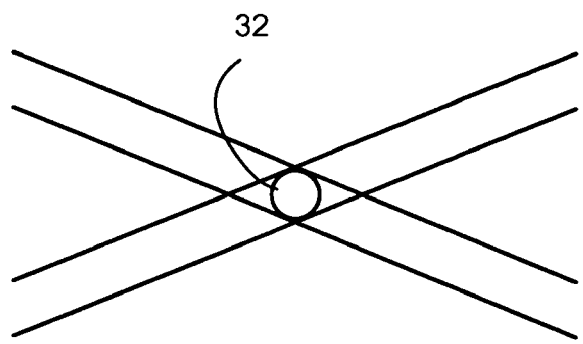
FIG. 11 is a plan view of a sensor array according to a fifth embodiment of the present invention.

FIG. 11 illustrates a plan view of the arrangement of lasers as the light source 28 in the present embodiment. It provides thorough coverage of the area below the projection lens PL but does not impinge on the exposure area 32.

Although this embodiment has been described using vertical distance and vertical velocity, it can also be applied to other directions.

Embodiment 6

Figure 12:
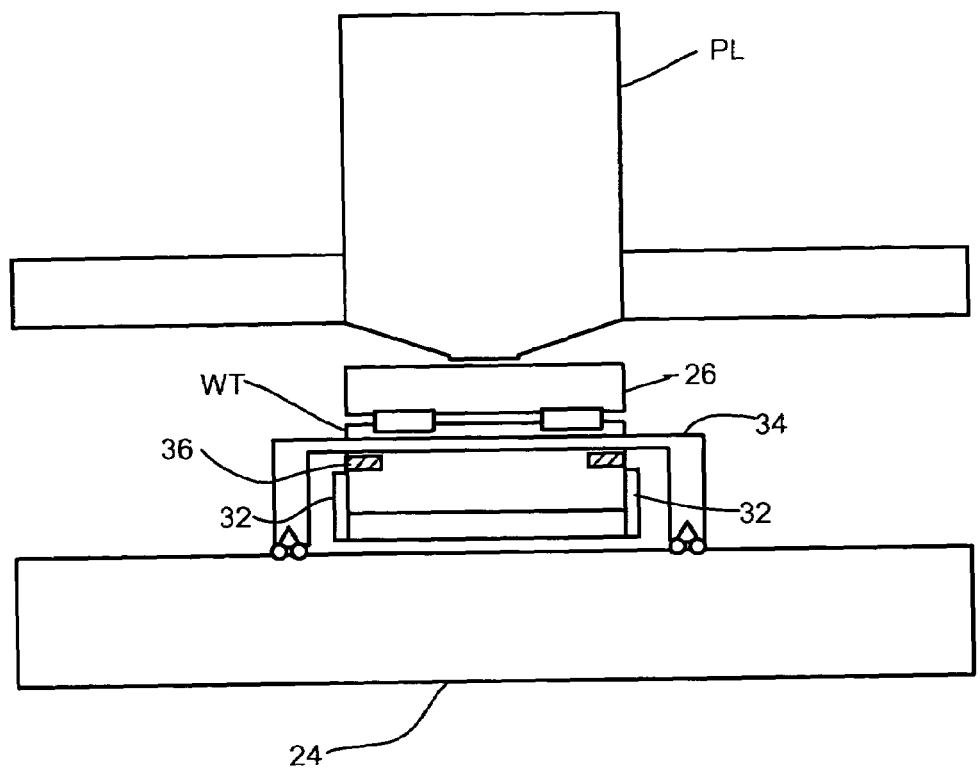
FIG. 12 depicts a lithographic apparatus, according to a sixth embodiment of the present invention.

A sixth embodiment of the present invention is illustrated in FIG. 12. The sixth embodiment has similar characteristics to the fifth embodiment, except for the attributes described below.

In this embodiment, a mechanical limiter 34 is mounted above the wafer table WT. The limiter 34 has legs mounted on bearings 38 which allow it to move freely over the magnet plate 24 in horizontal directions. However, the bearings 38 do not allow any vertical movement of the limiter 34. The mechanical limiter 34 follows the horizontal movements of the wafer table WT over the magnet plate 24.

In the event that the wafer table WT moves too high, the protrusions 36 engage with the top bar of the limiter 34 and prevent any further vertical movement. A vertical collision with the projection lens PL cannot then occur.

Although the operation of the limiter protects the components of the projection lens PL from damage in a collision, there is a possibility that the wafer table WT could damaged if the engagement of the protrusions 36 with the limiter 34 is violent. For this reason, the gap sensors monitor the gap between the planar motor 22 and the magnet plate 24 as an indirect measure of the gap between the protrusions 36 and the limiter 34. When the distance is such that the protrusions 36 are likely to engage with the limiter 34, the vertical speed can be limited to a value which minimizes the possibility of damage to the wafer table WT.

Embodiment 7

Figure 13:
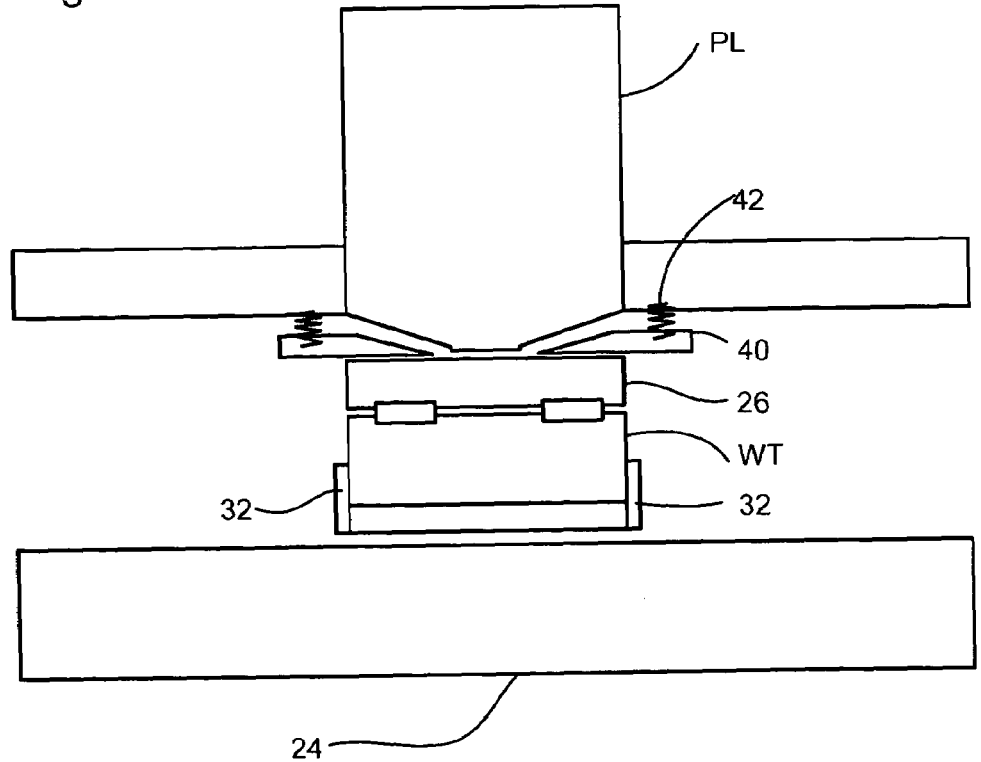
FIG. 13 depicts a lithographic apparatus, according to a seventh embodiment of the present invention.

A seventh embodiment of the present invention is illustrated in FIG. 13. The seventh embodiment has similar characteristics to the fifth embodiment, except for the attributes described below.

In this embodiment, a crash protection rim 40 is provided on the reference frame. The crash rim 40 can move relative to the reference frame in a vertical direction and is mounted on the reference frame by dampers 42. The lower face of the crash rim 40 extends below the projection lens PL by a distance greater than the maximum crash stroke required by the dampers to absorb a collision.

In the event of a collision, between the mirror block 26 and the projection lens PL the dampers 42 compress to absorb the force of the impact.

The design of crash rim aims to minimize the crash stroke required by the dampers, and hence the distance that the crash rim 40 must extend below the projection lens PL. An indirect measure of the distance of between the crash rim 40 and the mirror block 26 is provided by the gap sensors 32. With this information the vertical speed can be limited when the distance is small, reducing the kinetic energy of any collision and allowing a smaller crash stroke of the dampers 42.

The techniques in the above described first to third embodiments could be applied to the crash rim 40 to cope with off-center crashes.

Embodiment 8

Figure 14:
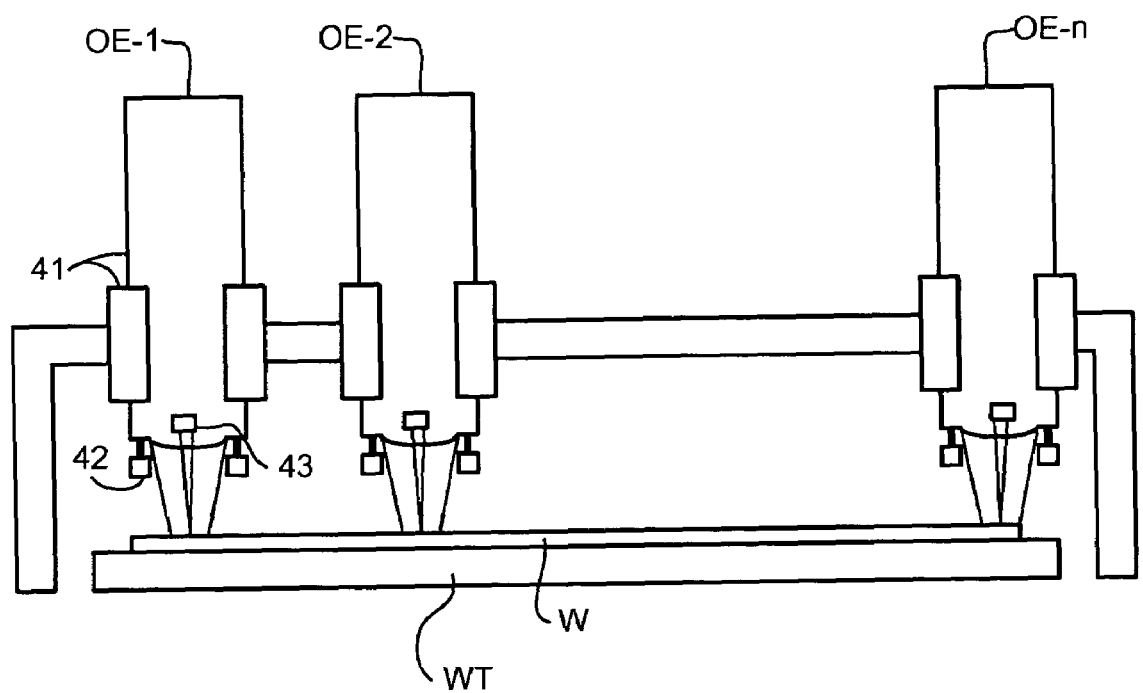
FIG. 14 depicts a lithographic apparatus, according to an eighth embodiment of the present invention.

As depicted in FIG. 14, an eighth embodiment of the invention is directed to an apparatus for lithographic printing onto large substrates (e.g. glass plates of perhaps 2 m by 0.5 m to be used in flat panel displays such as LCDs). The substrate W is mounted on a substrate table W and is scanned through the machine in the Y direction. A plurality of optical engines OE-1 to OE-n are mounted in a staggered array on a frame over the substrate so that although each optical engine can only image on a small part of the substrate, the complete array covers the entire width of the substrate.

Since the substrate W may not be sufficiently flat, each of the optical engines is independently moveable in the Z direction by actuators 41 so that the image projected by each optical engine can be brought into best focus on the substrate surface. The working distance between the optical engines OE-1 to OE-n and the substrate may be very small, especially if the final element of the optical engine is a microlens array, and comparable to height variations in the substrate W surface. To achieve high throughput, the substrate W may move at a high speed. As such, there is a risk of collision between the optical engines OE-1 to OE-n and the substrate W.

Each of the optical engines OE-1 to OE-n is provided with a mechanical crash protection system 42 which may be similar to that of the first to third, sixth or seventh embodiment adapted as necessary to the fact that the optical engine is moving rather than the substrate table. In addition, the optical engines OE-1 to OE-n are provided with a sensor 43 for determining the distance between the optical engine OE and the substrate W.

If the distance drops below a predetermined safe limit, the actuators 41 are operated to halt any downward movement and/or raise the optical engine OE-1 to OE-n to a safe height. Fail-safe brakes may also be engaged. As in the fourth and fifth embodiments, the safe limit may be dependent on the speed of movement of the optical engine OE-1 to OE-n and/or the substrate W. The sensors 43 preferably sense the relative height of the substrate W surface at a position ahead of the optical engine in the scanning, Y, direction so as to give advance warning of any raised part of the substrate W. The sensor may be the same sensor as used to control focus or a separate sensor. Suitable sensor types include level sensors as well known in the art of lithography, interferometric sensors, capacitive sensors, air gages, etc.

While specific embodiments of the invention have been described above, it will be appreciated that the invention may be practiced otherwise than as described. The configuration, operation, and behavior of the present invention has been described with the understanding that modifications and variations of the embodiments are possible, given the level of detail present herein. For example, the features of the various embodiments could be combined. In particular, a crash protection rim of the first to third embodiment could be provided in the systems of the fourth to seventh embodiments.

Thus, the preceding detailed description is not meant or intended to, in any way, limit the invention —rather the scope of the invention is defined by the appended claims.

What is claimed is:

1. A lithographic apparatus, comprising:
   an illumination system configured to direct a beam of radiation;
   a support configured to support a patterning device that imparts the beam of radiation with a pattern in its cross-section;
   a substrate holder configured to hold a substrate;
   a projection system configured to project the patterned beam onto a target portion of the substrate; and
   a collision protection system configured to avoid collisions between a first and a second part of the apparatus in which at least one actuator system can generate relative displacement between the first and second parts, the collision protection system comprising:
   at least one sensor system to determine the relative position and/or velocity of the first and second parts, and
   a controller to control the at least one actuator system to prevent the first and second parts from moving closer together in the event that the sensor system determines that the relative position and/or velocity of the first and second parts indicate a potential collision.

2. The apparatus according to claim 1, wherein the first part comprises the substrate holder and the at least one sensor system is adapted to measure the relative position and velocity of the substrate holder and wherein the controller is adapted to control the velocity of the substrate holder based on the relative position and velocity determined from the at least one sensor, information regarding positions of potential obstacles to the substrate holder, and information regarding a stopping distance of the substrate holder.

3. The apparatus according to claim 1, wherein the controller is adapted to control the actuator system to ensure a (i) measured distance between the first and second parts remains greater than a predetermined minimum distance, or (ii) a measured velocity does not exceed a predetermined maximum velocity, or (iii) both (i) and (ii).

4. The apparatus according to claim 1, wherein the at least one sensor system is adapted to measure the relative positions of the first and second parts in a direction perpendicular to an optical axis of the projection system.

5. The apparatus according to claim 4, wherein the projection system comprises a plurality of optical engines and wherein the apparatus further includes a plurality of collision protection systems in which each collision protection system avoids collisions between one of the optical engines, which comprise the first part, and the substrate, which comprises the second part.

6. The apparatus according to claim 1, wherein the collision protection system further comprises a rim which projects beyond at least one edge of said first part, the rim being connected to the first part by at least one damper for relative movement thereto.

7. The apparatus according to claim 6, wherein the first part comprises the the substrate holder.

8. The apparatus according to claim 6, wherein the first part comprises the substrate holder and the second part comprises another substrate holder.

9. The apparatus according to claim 1, wherein the first part comprises the projection system and the second part comprises the substrate holder.

10. A device manufacturing method, comprising:
    providing a substrate;
    providing a beam of radiation using an illumination system;
    imparting the beam of radiation with a desired pattern in its cross-section based on a patterning device;
    projecting the patterned beam of radiation onto a target portion of the substrate;
    measuring a position, or a velocity, or both, of a moving part of the apparatus;
    determining whether a collision between the moving part and an obstacle is likely to occur; and
    controlling movement of the moving part to avoid the collision or reduce the impact of the collision.

11. The method according to claim 10, wherein the measuring further comprises:
    comparing the measured position and velocity with known positions of obstacles and a known stopping distance of the moving part; and controlling the velocity of said moving part based on the comparison.

12. The method according to claim 10, wherein the measuring determines (i) a distance between the moving part and an obstacle, or (ii) velocity of the moving part as it moves towards the obstacle, or (iii) both (i) and (ii), wherein the measuring further comprises:

controlling the velocity of the moving part to ensure that (iv) the measured distance is greater than a predetermined minimum distance, or (v) the measured velocity does not exceed a predetermined maximum velocity, or (vi) both (iv) and (v).

13. The method according to claim 10, wherein the moving part further comprises a rim which projects beyond at least one edge of the moving part in a first direction, the rim being connected to the moving part by at least one damper for relative movement thereto.

14. The method according to claim 10, wherein projecting the patterned beam of radiation comprises projecting the patterned beam of radiation using a plurality of optical engines and wherein the moving part comprises at least one of the optical engines and the obstacle comprises the substrate.

15. The method according to claim 10, wherein the obstacle comprises the projection system and the moving part comprises the substrate.

16. A lithographic apparatus, comprising:
a substrate holder configured to hold a substrate;
a projection system configured to project a patterned beam onto a target portion of the substrate; and
a sensor system configured to determine the relative position of first and second parts of the lithographic apparatus; and
a controller configured to determine a maximum allowed velocity of the first part based on the relative position of the first and second parts and if a velocity of the first part exceeds the maximum allowed velocity, to cause reduction of the velocity of the first part.

17. The apparatus according to claim 16, wherein the first part comprises the substrate holder and wherein the controller is adapted to control the velocity of the substrate holder based on the relative position determined from the sensor and information regarding a stopping distance of the substrate holder.

18. The apparatus according to claim 16, wherein the controller is adapted to control the first part to ensure a measured distance between the first and second parts remains greater than a predetermined minimum distance.

19. The apparatus according to claim 16, wherein the sensor is further configured to measure a velocity of the first part and the controller is adapted to control the first part to ensure the measured velocity does not exceed a predetermined maximum velocity.

20. The apparatus according to claim 16, wherein the first part comprises the substrate holder and the second part comprises another substrate holder.

21. The apparatus according to claim 16, wherein the first part comprises the projection system and the second part comprises the substrate holder.

n

* * * * *